(12) United States Patent
Choi et al.

(10) Patent No.: US 8,741,753 B2
(45) Date of Patent: Jun. 3, 2014

(54) USE OF BAND EDGE GATE METALS AS SOURCE DRAIN CONTACTS

(75) Inventors: Kisik Choi, Hopewell Junction, NY (US); Christian Lavoie, Ossining, NY (US); Paul M. Solomon, Yorktown Heights, NY (US); Bin Yang, Ossining, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,736

(22) Filed: Sep. 12, 2012

(65) Prior Publication Data

US 2013/0241008 A1    Sep. 19, 2013

Related U.S. Application Data

(63) Continuation of application No. 13/421,276, filed on Mar. 15, 2012.

(51) Int. Cl.
*H01L 21/20* (2006.01)
*H01L 21/3205* (2006.01)
*H01L 21/00* (2006.01)

(52) U.S. Cl.
USPC .............. 438/586; 438/584; 257/E21.001

(58) Field of Classification Search
CPC ....... H01L 21/283; H01L 21/30; H01L 21/31; H01L 21/44; H01L 21/441; H01L 21/46; H01L 21/461; H01L 21/4763; H01L 21/47635
USPC ................................ 438/142, 197; 257/213

See application file for complete search history.

(56) References Cited

U.S. PATENT DOCUMENTS

| | | | | |
|---|---|---|---|---|
| 5,681,779 A | * | 10/1997 | Pasch et al. | 438/642 |
| 5,976,962 A | * | 11/1999 | Oda | 438/592 |
| 6,261,932 B1 | * | 7/2001 | Hulfachor | 438/570 |
| 7,126,169 B2 | * | 10/2006 | Kitabatake | 257/192 |
| 7,189,648 B2 | | 3/2007 | Lander et al. | |
| 7,314,787 B2 | * | 1/2008 | Yagishita | 438/197 |
| 7,525,171 B2 | * | 4/2009 | Kimoto | 257/471 |
| 7,598,545 B2 | | 10/2009 | Cartier et al. | |
| 7,642,165 B2 | * | 1/2010 | Shingu et al. | 438/275 |
| 7,642,604 B2 | * | 1/2010 | Nishi et al. | 257/368 |
| 7,709,902 B2 | | 5/2010 | Doris et al. | |

(Continued)

OTHER PUBLICATIONS

Cha et al., "Work Function and Thermal Stability of Ti1-x AlxNy for dual Metal Gate Electrodes", Applied Physics Letters, vol. 81, No. 22, Nov. 25, 2002.

(Continued)

*Primary Examiner* — Seahvosh Nikmanesh
*Assistant Examiner* — Evren Seven
(74) *Attorney, Agent, or Firm* — Harrington & Smith

(57) ABSTRACT

A device includes a gate stack formed over a channel in a semiconductor substrate. The gate stack includes a layer of gate insulator material, a layer of gate metal overlying the layer of gate insulator material, and a layer of contact metal overlying the layer band edge gate metal. The device further includes source and drain contacts adjacent to the channel. The source and drain contacts each include a layer of the gate metal that overlies and is in direct electrical contact with a doped region of the semiconductor substrate, and a layer of contact metal that overlies the layer of gate metal.

24 Claims, 11 Drawing Sheets

(56) References Cited

U.S. PATENT DOCUMENTS

| | | | |
|---|---|---|---|
| 7,812,414 B2 | 10/2010 | Hou et al. | |
| 7,816,729 B2 * | 10/2010 | Hshieh | 257/330 |
| 7,838,353 B2 | 11/2010 | Anderson et al. | |
| 7,977,182 B2 * | 7/2011 | Nishi et al. | 438/233 |
| 7,999,298 B2 * | 8/2011 | Kavalieros et al. | 257/301 |
| 8,021,904 B2 * | 9/2011 | Chitnis | 438/46 |
| 8,022,474 B2 * | 9/2011 | Haeberlen et al. | 257/331 |
| 8,097,500 B2 * | 1/2012 | Ando et al. | 438/197 |
| 8,198,676 B2 * | 6/2012 | Iwamuro | 257/330 |
| 8,299,507 B2 * | 10/2012 | Shimizu et al. | 257/288 |
| 8,367,507 B1 | 2/2013 | Tsuchiya et al. | 438/299 |
| 8,420,519 B1 * | 4/2013 | Triyoso et al. | 438/592 |
| 2005/0167766 A1 * | 8/2005 | Yagishita | 257/410 |
| 2006/0038229 A1 | 2/2006 | Tsuchiya et al. | 257/351 |
| 2007/0120204 A1 * | 5/2007 | Yagishita | 257/410 |
| 2007/0267762 A1 * | 11/2007 | Yu et al. | 257/E29.148 |
| 2008/0191285 A1 | 8/2008 | Ko et al. | 257/369 |
| 2008/0277726 A1 | 11/2008 | Doris et al. | 257/351 |
| 2009/0014813 A1 | 1/2009 | Chao et al. | |
| 2009/0101972 A1 * | 4/2009 | Gaines et al. | 257/335 |
| 2009/0124030 A1 * | 5/2009 | Seong et al. | 438/22 |
| 2009/0181505 A1 | 7/2009 | Ando et al. | |
| 2009/0321842 A1 | 12/2009 | Matsubara | |
| 2010/0264497 A1 | 10/2010 | Chang et al. | 257/393 |
| 2011/0031481 A1 * | 2/2011 | Von Wrochem et al. | 257/40 |
| 2011/0114914 A1 * | 5/2011 | Numata et al. | 257/9 |
| 2011/0198693 A1 * | 8/2011 | Shiomi et al. | 257/339 |
| 2012/0018810 A1 | 1/2012 | Chambers et al. | 257/369 |
| 2012/0238086 A1 * | 9/2012 | Hempel et al. | 438/591 |
| 2013/0153917 A1 * | 6/2013 | Romano et al. | 257/76 |
| 2013/0161754 A1 * | 6/2013 | Su et al. | 257/369 |
| 2013/0168773 A1 * | 7/2013 | Hempel et al. | 257/368 |
| 2013/0241008 A1 * | 9/2013 | Choi et al. | 257/410 |
| 2013/0256787 A1 * | 10/2013 | XIE et al. | 257/330 |
| 2013/0280900 A1 * | 10/2013 | Lai et al. | 438/589 |

OTHER PUBLICATIONS

Maszara et al, "Transistors with Dual Work Function Metal Gates by Single Full Silicidatin (FUSI) of Polysilicon Gates", 2002 IEEE, 07-78307463-X/02.

Guo et al., "Gate-Dielectric Permitivity and Metal Gate Work-Function Tradeoff in Lmet=25 nm PDSOI Device Characteristics", IEEE Electron Device Letters, vol. 27, No. 6, Jun. 6, 2006.

Drummond, "Work Functions of the Transition Metals and Metal Silicides", Sandia National Laboratories, 1999 (SAN099-0391J).

* cited by examiner

USE OF BAND EDGE GATE METALS AS SOURCE DRAIN CONTACTS

CROSS-REFERENCE TO A RELATED PATENT APPLICATION

This patent application is a continuation application of copending U.S. patent application Ser. No. 13/421,276, filed Mar. 15, 2012, the disclosure of which is incorporated by reference herein in its entirety.

TECHNICAL FIELD

The exemplary embodiments of this invention relate generally to transistor devices and, more specifically, relate to complementary metal oxide semiconductor (CMOS) transistor devices and to the formation of source/drain (S/D) contacts for such devices.

BACKGROUND

Contact resistance has become a dominating factor and consideration as transistor devices such as field effect transistor (FET) devices are scaled to smaller dimensions. There is a need to provide a process and a structure to reduce contact resistance (S/D contact resistance) that are compatible with existing processes and that are also cost effective.

SUMMARY

In one non-limiting aspect thereof the exemplary embodiments of this invention provide a device that comprises a gate stack formed over a channel in a semiconductor substrate. The gate stack comprises a layer of gate insulator material, a layer of gate metal overlying the layer of gate insulator material, and a layer of contact metal overlying the layer band edge gate metal. The device further comprises source and drain contacts adjacent to the channel. The source and drain contacts each comprise a layer of the gate metal that overlies and is in direct electrical contact with a doped region of the semiconductor substrate, and a layer of contact metal that overlies the layer of gate metal.

BRIEF DESCRIPTION OF THE SEVERAL VIEWS OF THE DRAWINGS

FIG. 1A shows a partially fabricated preliminary structure for an nFET (left side of FIG. 1A) and a pFET (right side of FIG. 1A);

FIG. 1B shows the structure of FIG. 1A after poly exposure, a CMP and poly removal;

FIG. 1C shows the structure of FIG. 1B after a mask is applied everywhere but where a CA will be formed and a reactive ion etch is performed to define the CA;

FIG. 1D shows the structure of FIG. 1C after the CA is masked and a gate dielectric layer is applied to the inner surfaces of openings left after dummy gate removal;

FIG. 1E shows the structure of FIG. 1D after band edge (BE) gate metal deposition;

FIG. 1F shows the structure of FIG. 1E after a blanket deposition of CA metal; and FIG. 1G shows the structure of FIG. 1F after removal of the CA metal and the BE metal from the field.

FIG. 2A shows a partially fabricated preliminary structure for an nFET (left side of FIG. 2A) and a pFET (right side of FIG. 2A), where in this embodiment a gate dielectric layer (e.g., a high-k layer) is disposed beneath the dummy gate plug;

FIG. 2B shows the structure of FIG. 2A after poly exposure, a CMP and poly removal;

FIG. 2C shows the structure of FIG. 2B after a mask is applied everywhere but where a CA will be formed and a reactive ion etch is performed to define the CA; and FIG. 2D shows the structure of FIG. 2C after band edge (BE) gate metal deposition.

DETAILED DESCRIPTION

Figure 1A:
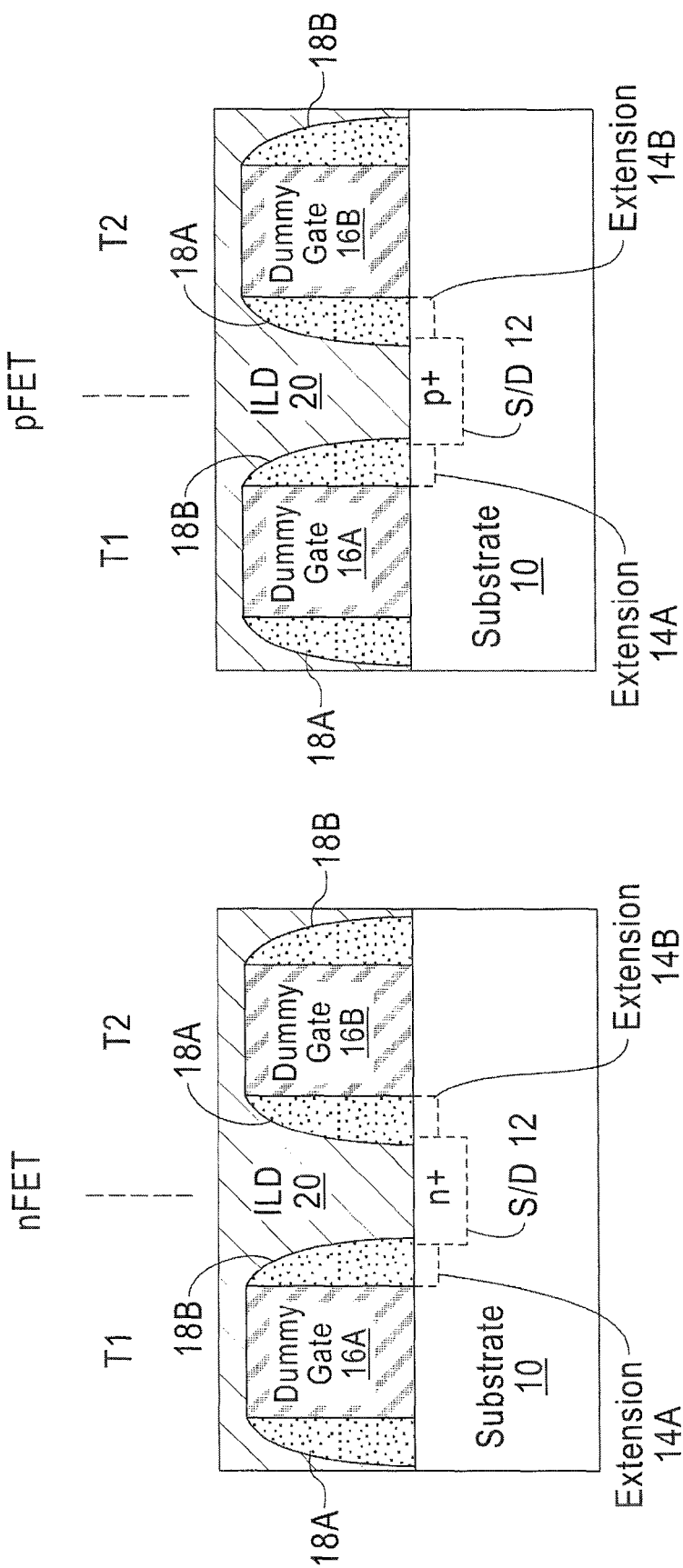
FIGS. 1A-1G, collectively referred to as FIG. 1, illustrate a process flow suitable for fabricating a transistor in accordance with embodiments of this invention, where

In accordance with an aspect of the exemplary embodiments of this invention gate metals are used as S/D contacts. The gate metal deposition can be by physical vapor deposition (PVD), chemical vapor deposition (CVD) or atomic layer deposition (ALD), as non-limiting examples of gate metal deposition processes. For an n-type FET (nFET) band edge (BE) gate metals include TiAl, TiAaN and TiN/Al/TiN as several non-limiting examples. For a p-type FET (pFET) the BE gate metals include thicker TiN, Re, Pt (and their carbides and nitrides) as several non-limiting examples.

The exemplary embodiments of this invention beneficially provide a BE gate metal as a S/D contact to reduce metal/Si contact resistance. By the use of these embodiments the need to provide a silicide can be eliminated. In addition there is a simplified process flow for fabricating metal contacts to the gate and the S/D, and a metal fill step can be simultaneously performed for the gate and the S/D.

The concept of a BE metal is conventionally referred to one of the conduction band edge (NMOS) or the valence band edge (PMOS) of the constituent semiconductor material. A goal is to reduce or minimize the Schottky barrier height, i.e., the difference between the metal workfunction and the semiconductor (e.g., Si) electron affinity.

It can be noted that the eWF (effective workfunction) on different gate dielectrics (for the gate) or directly on the Si is not the same as the vacuum WF. This is generally explained by the Fermi level pinning model. Different interfaces can have different pinning factors such that the eWF could vary on different dielectrics. However, there is still a correlation between the vacuum WF and the eWF: a higher WF metal exhibits a relatively higher eWF.

As considered herein a band edge gate metal (with the band edge eWF on high K) may no longer have a band edge eWF on the S/D depending on the pinning factor difference, but can still have an eWF that is closer to the band edge as compared to other metal choices.

For Silicon the conduction band edge Ec: 4.05 eV and the valence band edge Ev: 5.17 eV. The workfunctions for various metals are well characterized. Reference can be made, for example, to pages 18 and 19 of "Work Functions of the Transition Metals and Metal Silicides", Timothy J. Drummond, Sandia National Laboratories, 1999 (SAN099-0391J).

In accordance with the embodiments of this invention, for a FET having a gate stack the use of the BE metal as a gate contact results in a reduction in the threshold voltage (Vt) of the FET. By applying the gate stack BE metal(s) to the S/D contacts the Schottky barrier height is reduced and current can more readily flow between the semiconductor material and the contact metal, which is manifested as a reduction in S/D resistance.

The presence of the BE gate metal on the S/D also beneficially implies that there is no need to form silicide. Silicide is conventionally used to reduce the interface contact resistance and to function as an adhesion of the CA metal to the substrate. In state-of-the-art FET devices, Nickel or Nickel-alloy silicides are typically used. It is known that the use of silicides can cause a yield loss due to metal diffusion into the substrate at typical processing temperatures (e.g., of about 300° C.) for silicide formation, especially through defects in substrates. The BE metals employed for fabricating the S/D contacts in accordance with the embodiments of this invention exhibit limited metal diffusion with no need of thermal treatment for silicide formation, thereby improving the yield.

The exemplary and non-limiting embodiments of this invention are described with reference to the process flow depicted in FIGS. 1A-1G, collectively referred to as FIG. 1. In general, FIG. 1 presents an enlarged cross-sectional view of a substrate 10 having various layers disposed over a major surface thereof. The various layer thicknesses are not drawn to scale.

FIG. 1A shows a partially fabricated preliminary structure for an nFET (left side of FIG. 1A) and a pFET (right side of FIG. 1A). The structures include a substrate 10, such as a Si substrate, or a Ge substrate, or a SiGe substrate, or a substrate formed of a Group III-V material (e.g., GaAs or an alloy thereof). A Si substrate will be assumed for explaining the process flow, although it should be appreciated that the Si substrate 10 is a non-limiting example of a suitable substrate. The substrate 10 could be a bulk substrate or a silicon on insulator (SOI) substrate. In the case of an SOI substrate 10 there will be an underlying layer of buried oxide (BOX), not shown. While depicted on two separate substrates in FIG. 1, it should be appreciated that the nFETs and the pFETs can be formed on the same substrate 10, and this will also be assumed in the ensuing discussion. Note that portions of two adjacent transistors (T1 and T2) are shown with, as a non-limiting example, a common Source or a common Drain (S/D) intentionally doped region 12 having associated extensions 14A, 14B. For the nFET the S/D region 12 can be made by an implant (e.g., an As implant) while for the pFET the 12 the S/D region 12 can be made by a p+ implant (e.g., a B implant). The implant dopant species concentration may be in a range of about, for example, $1 \times 10^{20}$ to about $4 \times 10^{20}$ atoms/$cm^3$. Also shown are two dummy gate structures 16A, 16B having spacers 18A, 18B and an interlayer dielectric (ILD) layer 20. The material of the dummy gate structures 16A, 16B may be amorphous Si or a nitride or any suitable sacrificial material, the spacers 18A, 18B may be any suitable spacer material such as a nitride (e.g., SiN), and the ILD 20 can be any suitable dielectric (oxide, such as $SiO_2$) material. The width of the dummy gates 16A, 16B defines the channel length of the resultant FETs and can be in a range of about, for example, 15 nm to about 35 nm, or more preferably about 20 nm to about 25 nm, and the height can be in a range of about 30 nm to about 50 nm. The spacing between the dummy gates 16A, 16B will typically be larger and may be in a range of about 30 nm to about 40 nm and will define at least in part the width of the Source or Drain contact area (CA) which can have similar dimensions to the gate dimensions. If one assumes that the S/D region 12 is, for example, a Source, then it is assumed that a Drain region (and extensions) is present (not shown) on the opposite sides of the dummy gates 16A, 16B and at least partially underlies the associated left-most spacer 18A and right-most spacer 18B. The processing described below applies equally to the Source and the Drain CAs.

Figure 1B:
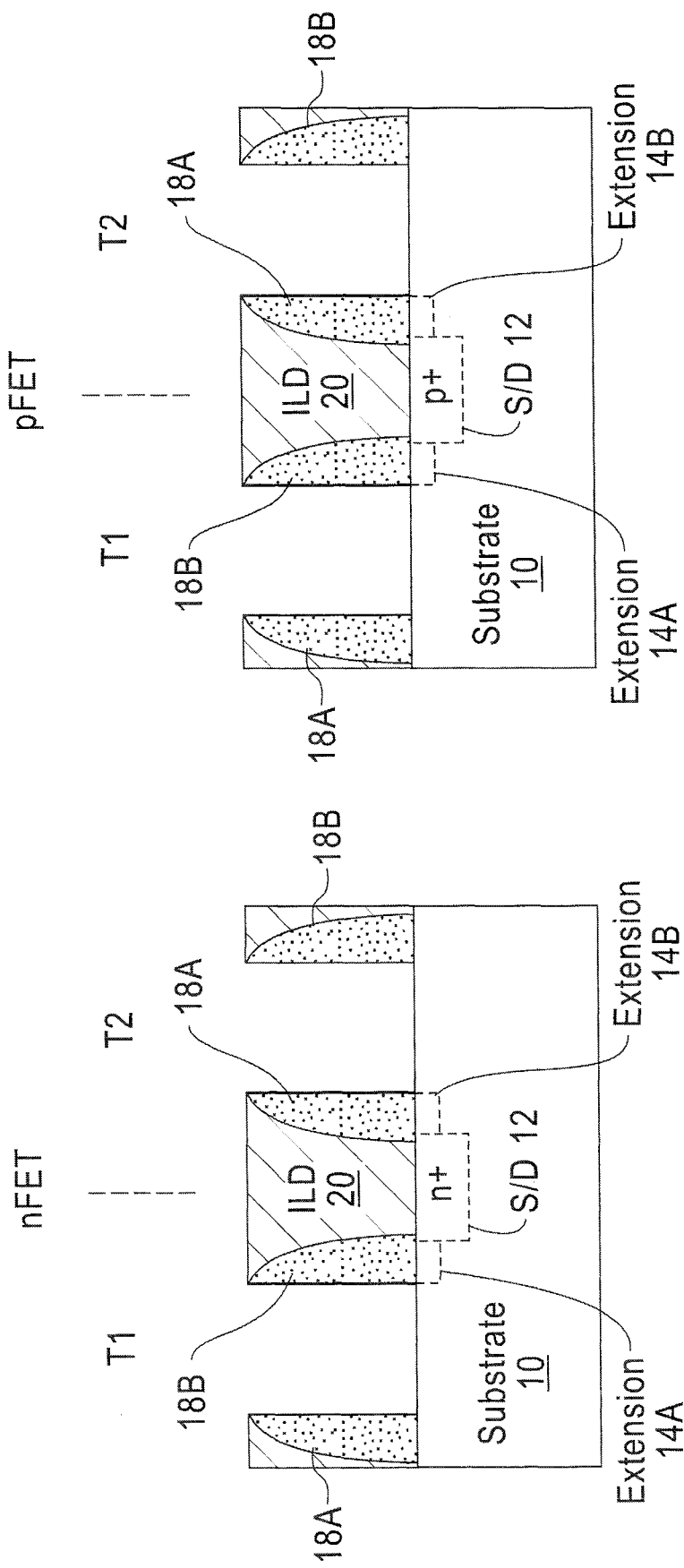

FIG. 1B shows the structure of FIG. 1A after poly exposure, a chemical-mechanical polish (CMP) and poly removal. At this point the material of the dummy gates 16A, 16B has been removed and the top surface of the ILD 20 has been planarized to the top of the spacers 18A, 18B.

Figure 1C:
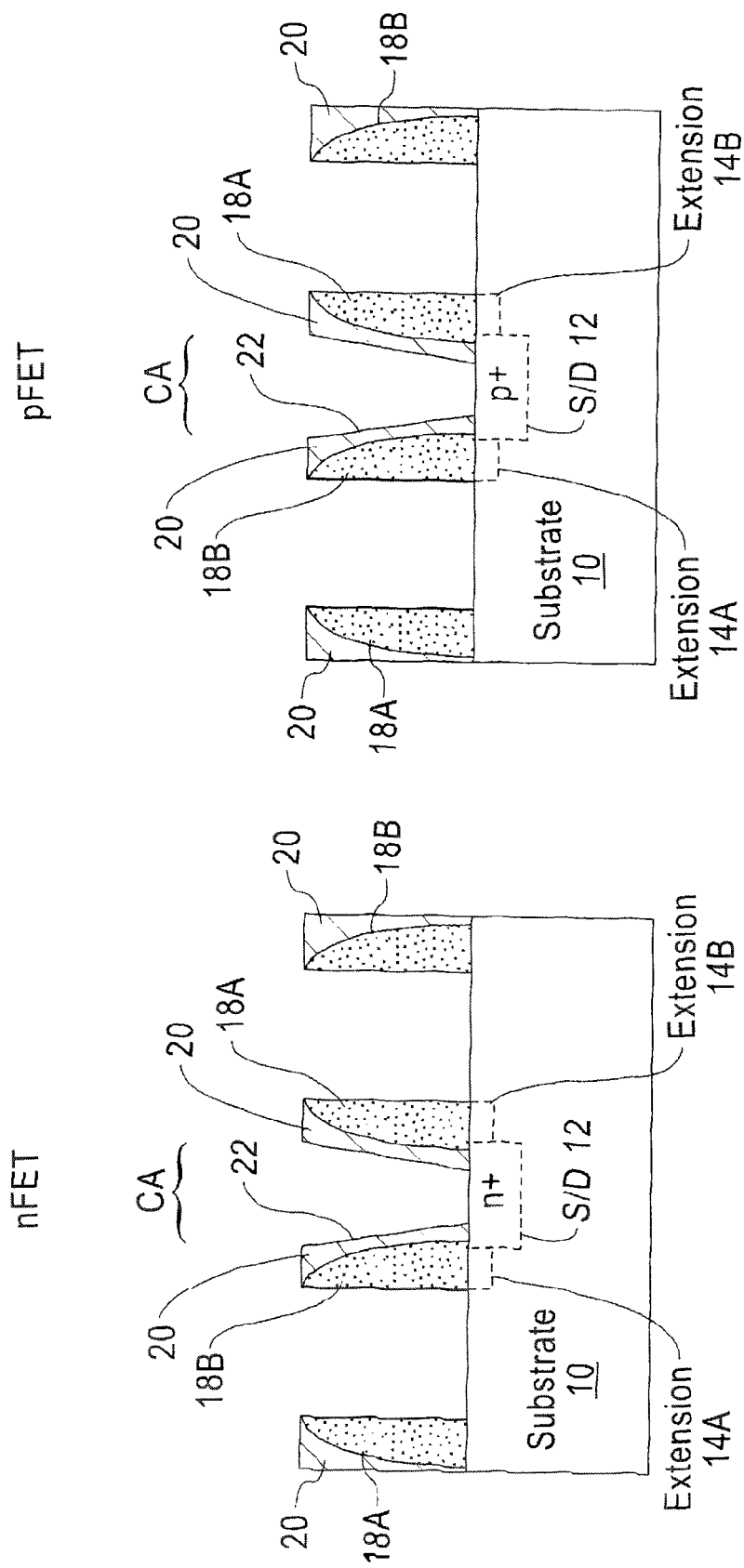

FIG. 1C shows the structure of FIG. 1B after a mask is applied everywhere but where the CA will be formed, and a reactive ion etch (RIE) is performed to remove the ILD 20 within the CA to expose within an opening 22 the underlying surface of the substrate 10 in the S/D region 12. The RIE chemistry is selected depending on the material of the ILD 20. Note that FIG. 1C shows the opening 22 as having sloping sidewalls. In other embodiments the sidewalls of the opening 22 can be substantially vertical, or the ILD material between the opposed spacers 18B, 18A can be removed entirely. The mask is also removed.

Figure 1D:
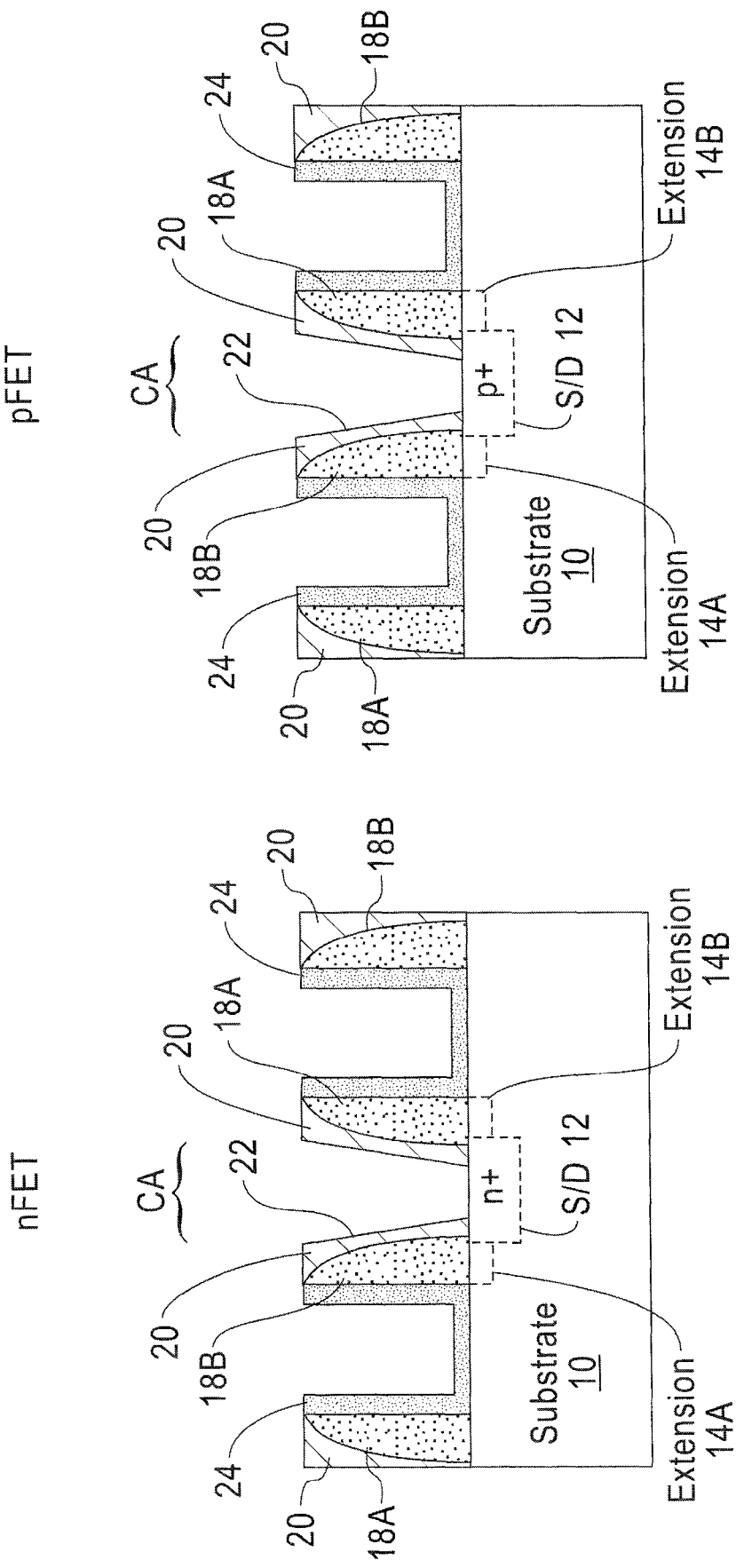

FIG. 1D shows the structure of FIG. 1C after the CA is masked and a gate dielectric layer 24 is applied to the inner surfaces of the openings left after the material of the dummy gates 16A, 16B was removed in the process step of FIG. 1B. The gate dielectric layer 24 can be any suitable dielectric material that will not be affected by subsequent processing steps. One particularly suitable material is a high dielectric constant (high-k) material comprising a dielectric metal oxide having a dielectric constant that is greater than the dielectric constant of silicon nitride of 7.5. The high-k dielectric layer 24 may be formed by methods well known in the art including, for example, CVD and ALD. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 24 may be from about 1 nm to about 10 nm, with about 5 nm being one suitable value. The mask over the CA is then removed.

Figure 1E:
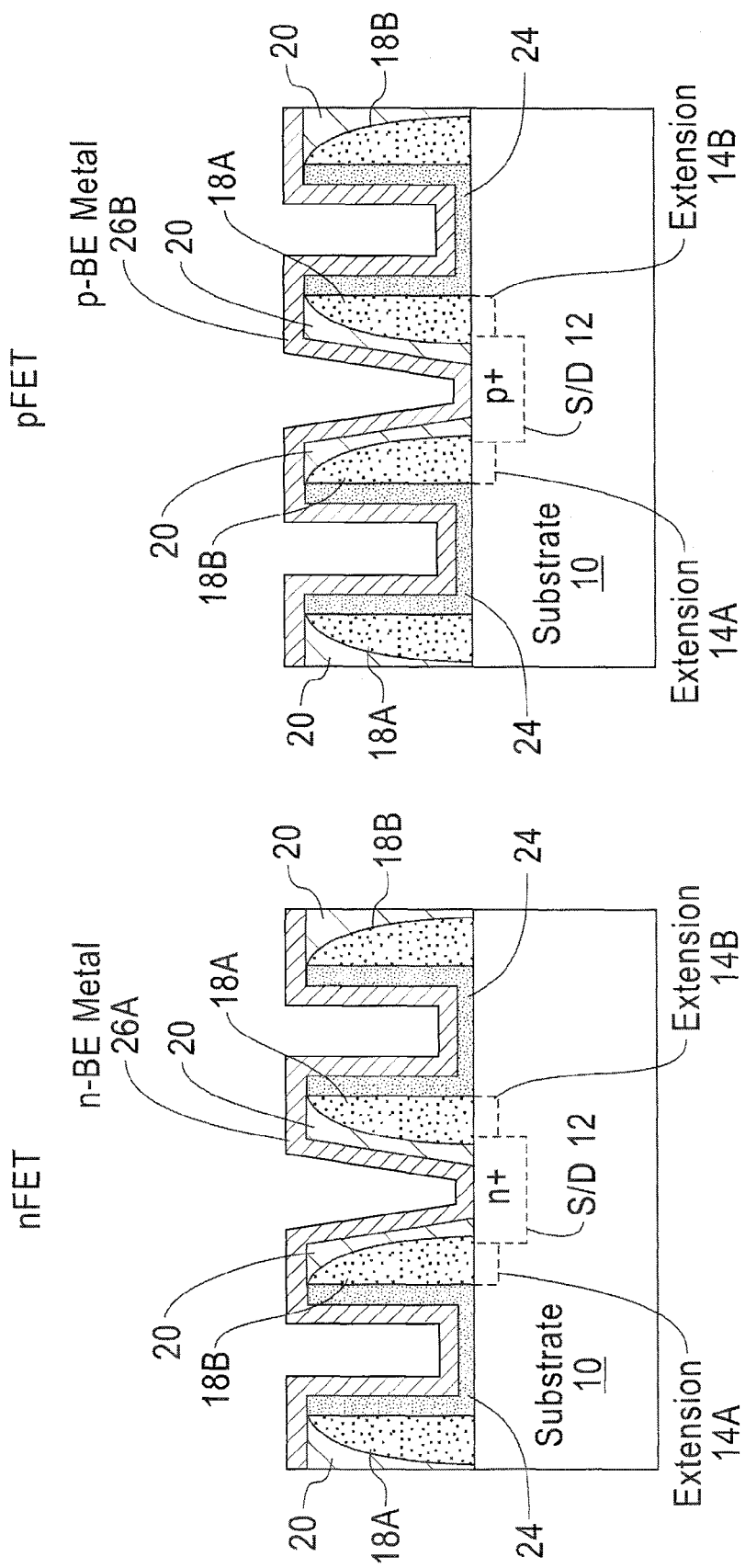

FIG. 1E shows the structure of FIG. 1D after BE gate metal deposition. In this process step the pFET is masked and nFET n-BE metal 26A is deposited. The mask is then removed from the pFET, the nFET is masked, and pFET p-BE metal 26B is deposited. The mask is then removed from the nFET. Of course, the process flow could be reversed to deposit the p-BE metal 26B first. The BE gate metal is deposited directly upon the high-k dielectric layer 24 in the gate regions, and deposited in the CA so that the exposed surface of the substrate 10 and the implanted S/D region 12 therein is directly contacted by the BE gate metal layer 26A, 26B. The BE gate metal 26 can have an exemplary thickness of up to about 20 nm, although a thickness of less than about 10 nm can be preferred. The BE metal 26 can be deposited, for example, by CVD, physical vapor deposition (PVD), or atomic layer deposition (ALD). Suitable and non-limiting nFET band edge metal 26A choices can be: Al, Ti, Er, Yb, Ta and their alloys, carbides, and nitrides. Suitable and non-limiting pFET band edge metal 26B choices can be: Pt, Ir, Pd, Rh, Co, Ni, Ru, Re, and their alloys, carbides and nitrides.

Figure 1F:
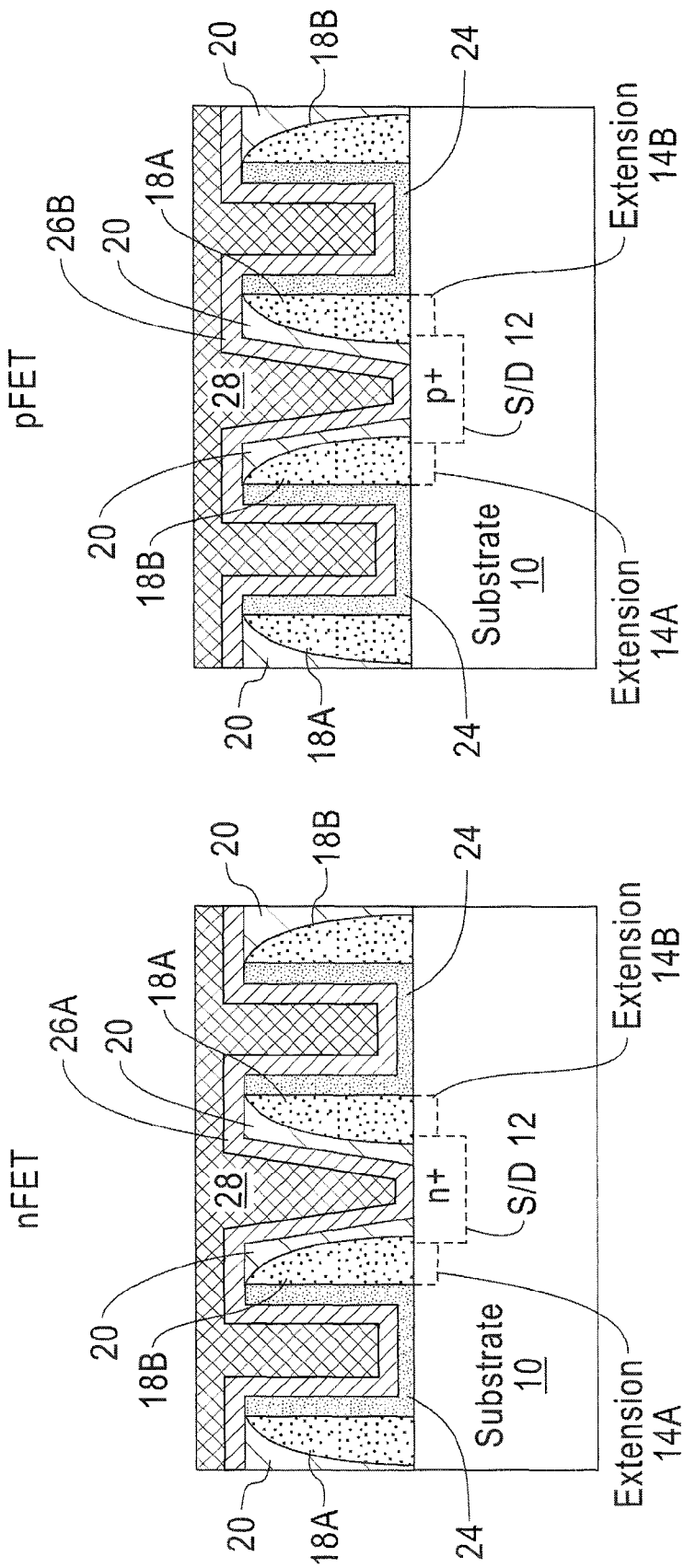

FIG. 1F shows the structure of FIG. 1E after a blanket deposition of CA metal 28. Any suitable contact metal can be employed such as, for example, Al, W or Cu, and the CA metal 28 can be deposited by any conventional process, including for example sputtering and CVD.

Figure 1G:
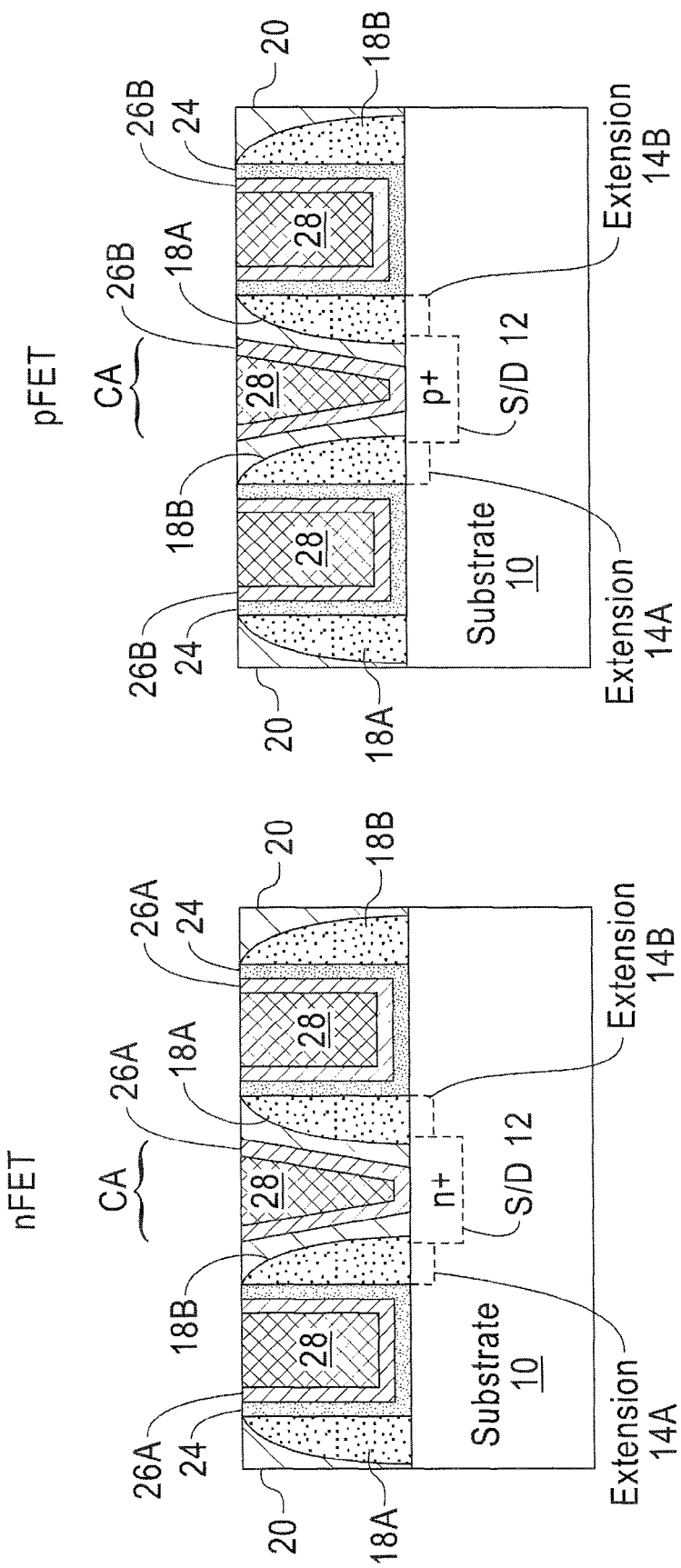

FIG. 1G shows the structure of FIG. 1F after removal of the CA metal 28 and the BE metal 26 from the field dielectrics. A CMP can be performed to planarize the surface.

The end result is that the CA is provided with a dual metal damascene comprising the layer of BE metal 26 in direct contact with the semiconductor substrate 10, and the Source or Drain implant region 12, and the overlying layer of CA metal 28. The layer of BE metal 26 in the CA in each type of transistor (nFET or pFET) is identical to the BE metal in the adjacent gate stack and can be deposited in the same process operation. The presence of the layer of BE metal 26 in the CA, in contact with the underlying semiconductor material of the S/D, reduces the Schottky barrier height and thus beneficially reduces S/D resistance. The disclosed processing beneficially eliminates the need to form a silicide.

It can be noted that the exemplary embodiments disclosed above assume the same BE gate metal in the gate stack and in the S/D contacts, however they do not have to be the same.

It is to be understood that the processes described by FIGS. 1A-1G are for illustration purposes. The processes to achieve band edge metal in the gate stack and S/D contacts can be different.

For example, reference can be made to FIG. 2 for showing a non-limiting example of an alternative process flow using, for example, a gate-first process. Structures that are found also in the embodiment of FIG. 1 are labeled accordingly.

Figure 2A:
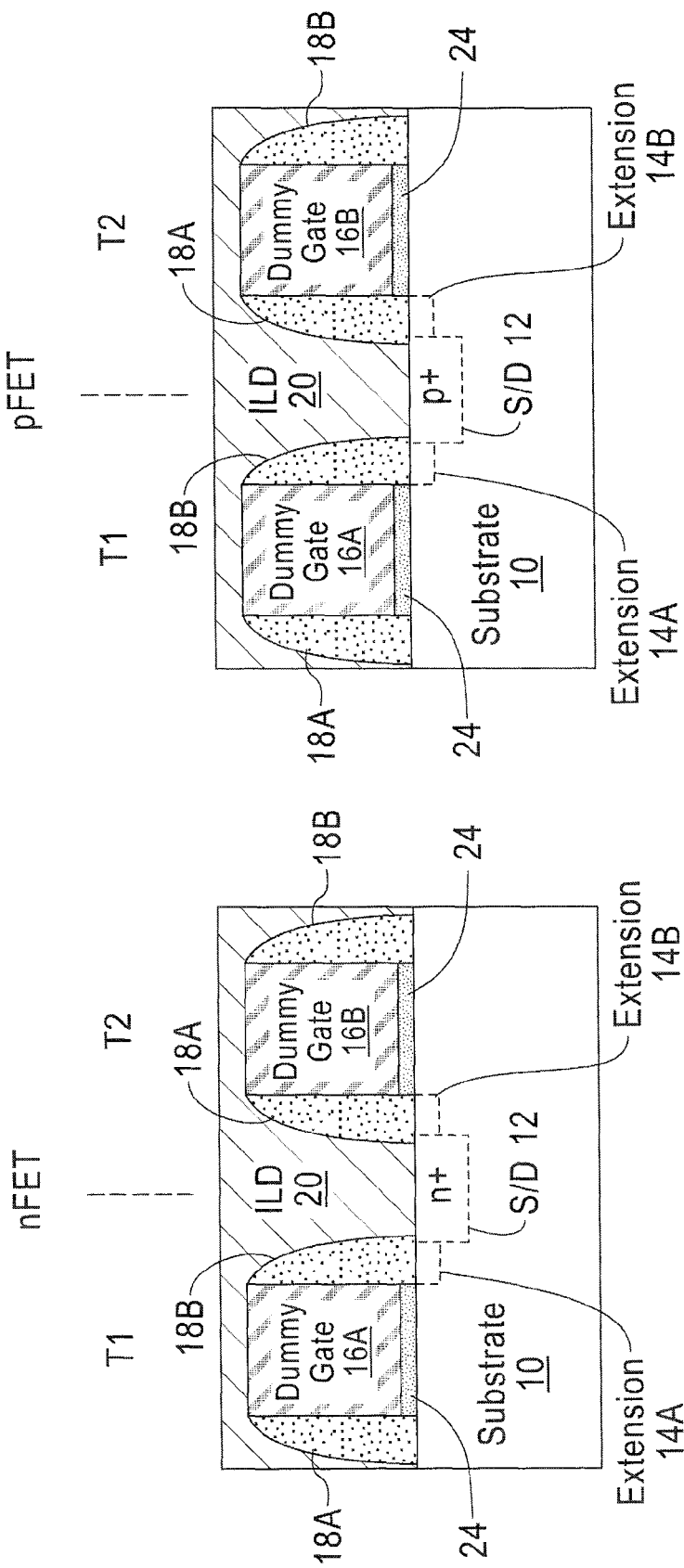
FIGS. 2A-2D, collectively referred to as FIG. 2, illustrate another process flow suitable for fabricating a transistor in accordance with embodiments of this invention, where

FIG. 2A is analogous to FIG. 1A and shows a partially fabricated preliminary structure for an nFET (left side) and a pFET (right side). The structure includes the substrate 10, such as a Si substrate, and shows portions of two adjacent transistors (T1 and T2). The common Source or common Drain (S/D) intentionally doped region 12 has the associated extensions 14A, 14B. For the nFET the S/D region 12 can be made by an n+ implant (e.g., an As implant) while for the pFET the 12 the S/D region 12 can be made by a p+ implant (e.g., a B implant). The implant dopant species concentration may be in the range of about, for example, $1 \times 10^{20}$ to about $4 \times 10^{20}$ atoms/cm$^3$. Also shown are the two dummy gate structures 16A, 16B having spacers 18A, 18B and an interlayer dielectric (ILD) layer 20. The material of the dummy gate structures 16A, 16B may be amorphous Si or a nitride or any suitable sacrificial material, the spacers 18A, 18B may be any suitable spacer material such as a nitride (e.g., SiN), and the ILD 20 can be any suitable dielectric (oxide, such as SiO$_2$) material. In general the various dopants and ranges of thicknesses, dimensions, dopant concentrations can be the same as described above for FIG. 1A.

However, in this embodiment the layer of gate dielectric layer 24 has been applied to the substrate 10 prior to the formation of the two dummy gate structures 16A, 16B. The gate dielectric layer 24 can be any suitable dielectric material that will not be affected by subsequent processing steps, and can comprise a layer of high-k material as discussed above. The thickness of the high-k dielectric layer 24 may be from about 1 nm to about 10 nm, with about 5 nm being one suitable value.

Figure 2B:
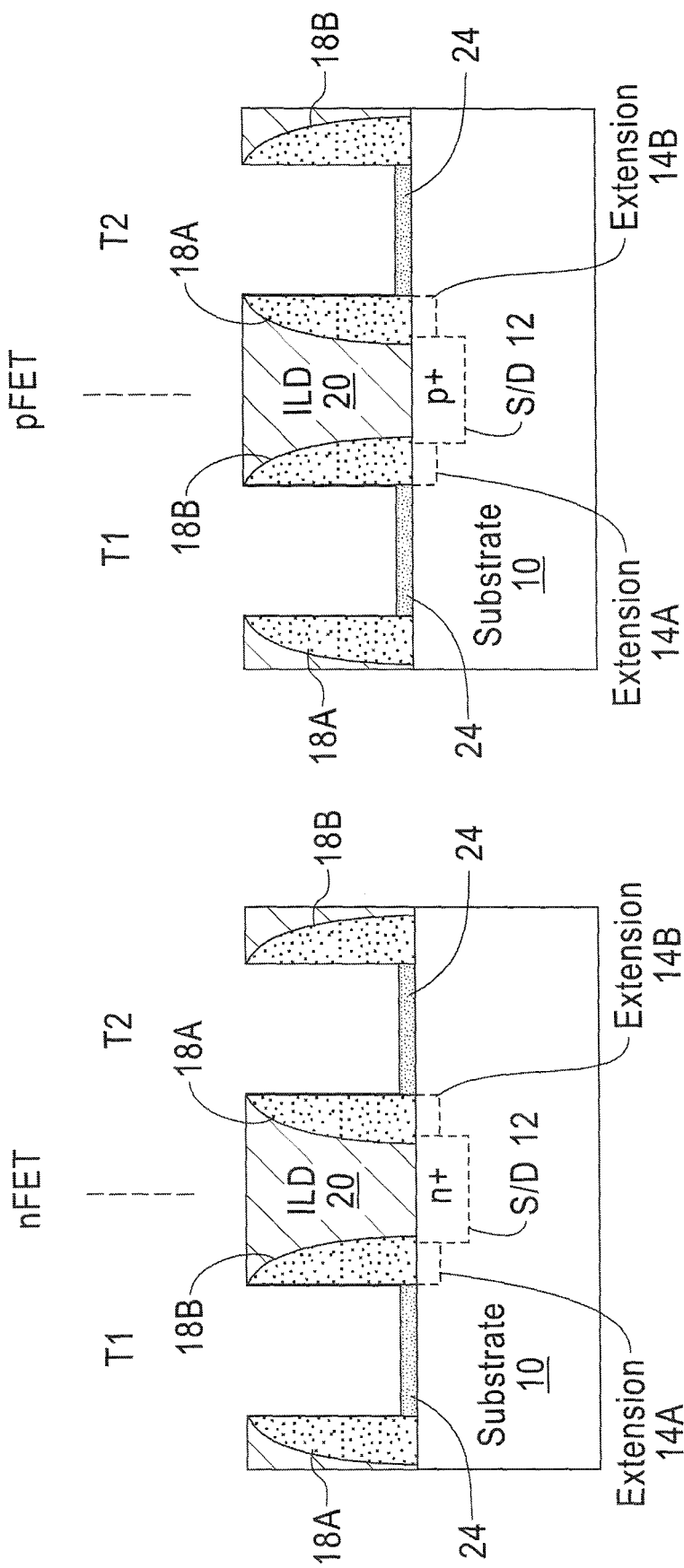

FIG. 2B shows the structure of FIG. 2A after poly exposure, a chemical-mechanical polish (CMP) and poly removal. At this point the material of the dummy gates 16A, 16B has been removed and the top surface of the ILD 20 has been planarized to the top of the spacers 18A, 18B. In this embodiment the removal of the dummy gates 16A, 16B exposes the surface of the underlying gate dielectric layer 24.

Figure 2C:
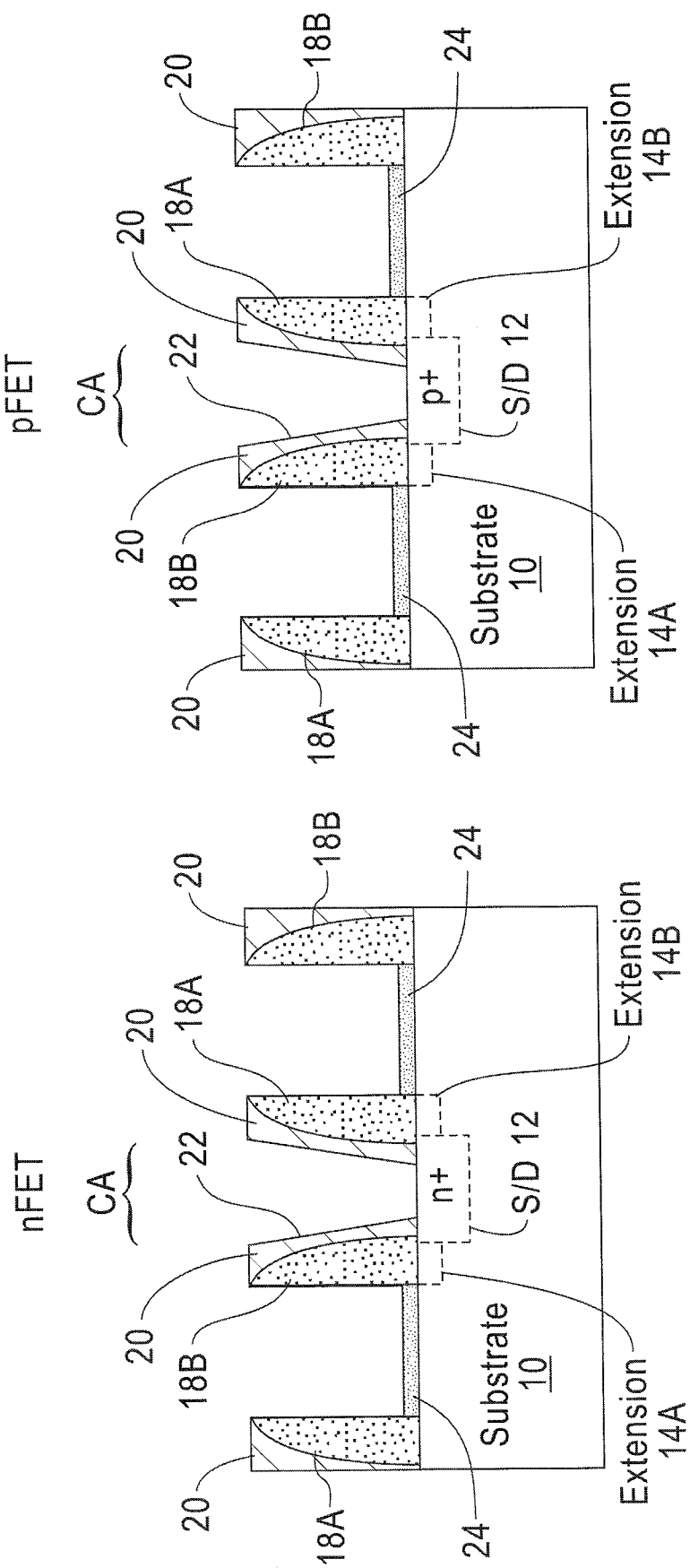

FIG. 2C shows the structure of FIG. 2B after a mask is applied everywhere but where the CA will be formed, and a reactive ion etch (RIE) is performed to remove the ILD 20 within the CA to expose within an opening 22 the underlying surface of the substrate 10 in the S/D region 12. The RIE chemistry is selected depending on the material of the ILD 20. FIG. 2C shows the opening 22 as having sloping sidewalls, although in other embodiments the sidewalls of the opening 22 can be substantially vertical, or the ILD material between the opposed spacers 18B, 18A can be removed entirely. The mask is also removed.

Figure 2D:
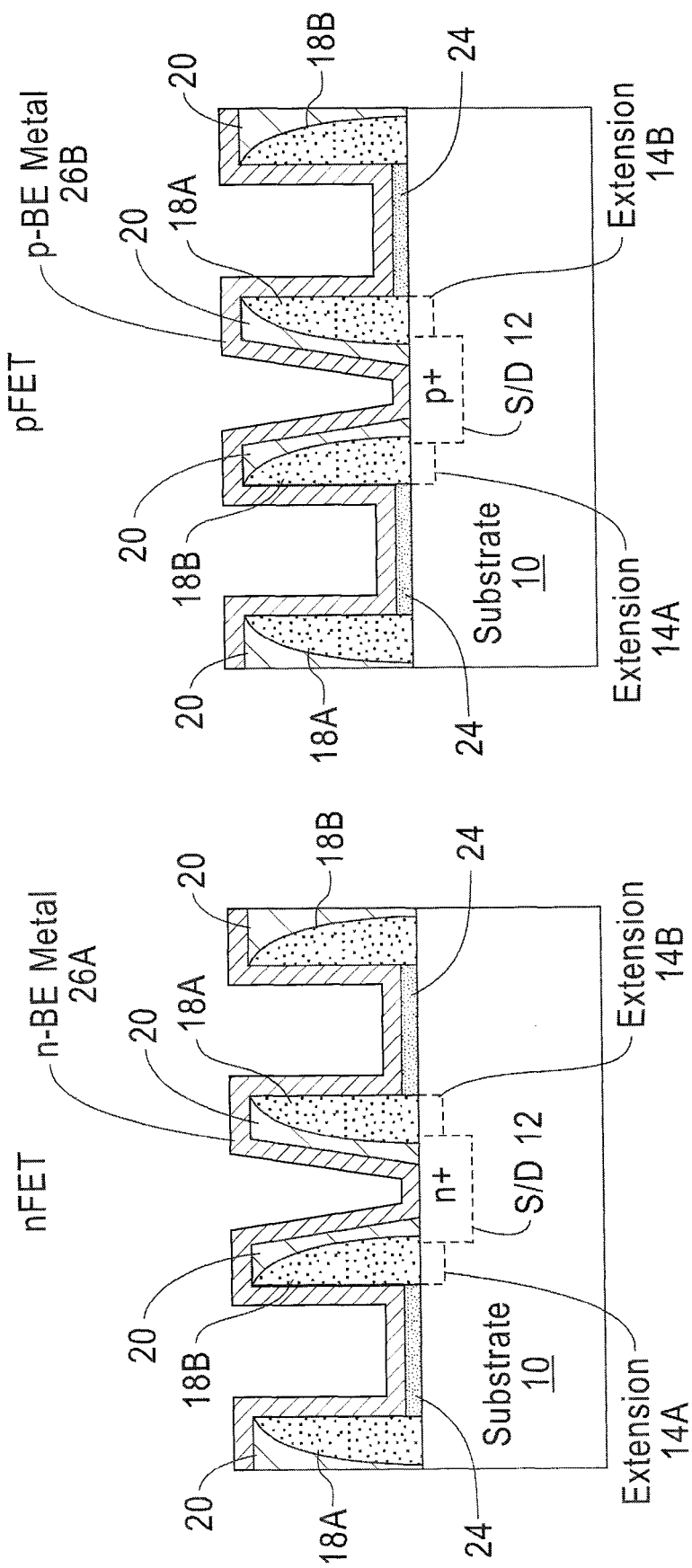

FIG. 2D shows the structure of FIG. 2C after BE gate metal deposition. In this process step the pFET is masked and nFET n-BE metal 26A is deposited. The mask is then removed from the pFET, the nFET is masked, and pFET p-BE metal 26B is deposited. The mask is then removed from the nFET. As in the embodiment of FIG. 1E, the process flow could be reversed to deposit the p-BE metal 26B first. The BE gate metal is deposited directly upon the high-k dielectric layer 24 at the bottom of the gate regions, and deposited in the CA so that the exposed surface of the substrate 10 and the implanted S/D region 12 therein is directly contacted by the BE gate metal layer 26A, 26B. The BE gate metal 26 can have an exemplary thickness of up to about 20 nm, although a thickness of less than about 10 nm can be preferred. The BE metal 26 can be deposited, for example, by CVD, physical vapor deposition (PVD), or atomic layer deposition (ALD). Suitable and non-limiting nFET band edge metal 26A choices can be: Al, Ti, Er, Yb, Ta and their alloys, carbides, and nitrides. Suitable and non-limiting pFET band edge metal 26B choices can be: Pt, Ir, Pd, Rh, Co, Ni, Ru, Re, and their alloys, carbides and nitrides.

Processing then continues as described above with respect to FIG. 1F and FIG. 1G to perform the blanket deposition of the CA metal 28, the removal of the CA metal 28 and the BE metal 26 from the field dielectrics, and a CMP operation to planarize the surface.

It is to be understood that although the exemplary embodiments discussed above with reference to FIGS. 1A-1G and FIGS. 2A-2D are described with regard to planar devices, the processes described herein may be used on common variants of FET devices including, e.g., FET devices with multi-fingered FIN and/or gate structures, FET devices of varying gate width and length, as well as ring oscillator devices. Moreover, the transistor device can be connected to metalized pads or other devices by conventional ultra-large-scale integration (ULSI) metalization and lithographic techniques.

It is to be understood that in addition to fabricating transistor device contacts as discussed above, further aspects of the present invention include methods to form contacts for other devices or otherwise constructing integrated circuits with various analog and digital circuitry. In particular, integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the exemplary embodiments of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the concepts of this invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including material deposition processes and material removal processes may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. A device, comprising:
   a gate stack formed over a channel in a semiconductor substrate, the gate stack comprising a layer of gate insulator material, a layer of gate metal overlying the layer of gate insulator material, and a layer of contact metal overlying the layer of gate metal;
   an interlayer dielectric layer having trenches therein to expose source and drain regions, wherein the gate metal also overlies sidewalls of the trenches; and
   source and drain contacts adjacent to said channel, said source and drain contacts each comprising a layer of said gate metal that overlies and is in direct electrical contact with a doped region of the semiconductor substrate, where
   the gate metal is a band edge gate metal selected in accordance with at least whether a p-type dopant or an n-type dopant comprises the doped regions that are in direct electrical contact with the gate metal of said source and drain contacts.

2. The device of claim 1, where the device is a p-type field effect transistor, where the doped regions are doped with a p-type dopant, and where the gate metal is comprised of at least one of Pt, Ir, Pd, Rh, Co, Ni, Ru, Re, and their alloys, carbides, and nitrides.

3. The device of claim 1, where the device is an n-type field effect transistor, where the doped regions are doped with an n-type dopant, and where the gate metal is comprised of at least one of Al, Ti, Er, Yb, Ta, and their alloys, carbides, and nitrides.

4. The device of claim 1, where the gate insulator layer is comprised of a high dielectric constant gate insulator material.

5. The device of claim 1, where the selected gate metal reduces a Schottky barrier height of the source and drain contacts.

6. A method to fabricate a structure, comprising:
   providing a semiconductor substrate having intentionally doped surface regions, the intentionally doped surface regions corresponding to locations of a source and a drain of a transistor;
   depositing a layer of a band edge gate metal directly onto a gate insulator layer in a gate region of the transistor while simultaneously depositing the band edge gate metal directly onto the surface of the semiconductor substrate to be in contact with the intentionally doped surface regions; and
   depositing a layer of contact metal directly onto-the layer of band edge gate metal in the gate region and directly onto the band edge gate metal deposited in the locations of the source and the drain.

7. The method of claim 6, where the transistor is a p-type field effect transistor, where the intentionally doped surface regions are doped with a p-type dopant, and where the band edge gate metal is comprised of at least one of Pt, Ir, Pd, Rh, Co, Ni, Ru, Re, and their alloys, carbides, and nitrides.

8. The method of claim 6, where the transistor is an n-type field effect transistor, where the intentionally doped surface regions are doped with an n-type dopant, and where the band edge gate metal is comprised of at least one of Al, Ti, Er, Yb, Ta, and their alloys, carbides, and nitrides.

9. The method of claim 6, where the gate insulator layer is comprised of a high dielectric constant gate insulator material.

10. The method of claim 6, where the gate region is formed by a replacement gate process that removes a dummy gate material leaving a gate opening in a dielectric material to expose an underlying surface of the substrate, further comprising forming openings in the dielectric material at locations of the source and the drain, masking the openings in the dielectric material at the locations of the source and the drain; depositing gate insulator material into the gate opening while preventing with the mask the deposition of the gate insulator material into the openings in the dielectric material at the locations of the source and the drain; removing the mask, depositing the band edge gate metal directly onto the gate insulator material in the gate opening and into the openings in the dielectric material at the locations of the source and the drain; and depositing the layer of contact metal over the band edge gate metal.

11. The method of claim 10, further comprising removing excess band edge gate metal and contact metal and planarizing a top surface of the structure.

12. The method of claim 6, where the gate region is formed by a gate-first process that removes a dummy gate material forming a gate opening that exposes an underlying surface of the gate insulator layer within the gate opening, further comprising depositing the band edge gate metal directly onto the gate insulator layer in the gate opening and into openings in the dielectric material at the locations of the source and the drain; and depositing the layer of contact metal over the band edge gate metal.

13. A method to reduce a Schottky barrier height of source/drain contacts of a field effect transistor, comprising:
   forming a gate stack comprising a gate insulator layer that overlies a surface of a semiconductor substrate;
   further forming the gate stack by depositing band edge gate metal directly onto en the gate insulator layer, while also depositing the band edge gate metal directly onto the surface of the semiconductor substrate at locations of the source/drain contacts; and
   further forming the gate stack by depositing contact metal directly onto the deposited band edge gate metal to form a gate contact and source/drain contacts.

14. The method of claim 13, where depositing the band edge gate metal on the gate insulator layer and also onto the surface of the semiconductor substrate simultaneously deposits the same band edge gate metal on the gate insulator layer and also onto the surface of the semiconductor substrate.

15. The method of claim 13, where depositing the contact metal is performed by blanket depositing the contact metal over the band edge metal.

16. The method of claim 13, where the field effect transistor is a p-type field effect transistor, where a surface region of the semiconductor substrate at the locations of the source/drain contacts is doped with a p-type dopant, and where the band edge gate metal is comprised of at least one of Pt, Ir, Pd, Rh, Co, Ni, Ru, Re, and their alloys, carbides, and nitrides.

17. The method of claim 13, where the field effect transistor is an n-type field effect transistor, where a surface region of the semiconductor substrate at the locations of the source/drain contacts is doped with an n-type dopant, and where the band edge gate metal is comprised of at least one of Al, Ti, Er, Yb, Ta, and their alloys, carbides, and nitrides.

18. The method of claim 13, where the gate insulator layer is comprised of a high dielectric constant gate insulator material.

19. The method of claim 13, where forming the gate stack comprises a replacement gate process that removes a dummy gate material leaving a gate opening in a dielectric material, and where the gate insulator layer is deposited in the gate opening subsequent to removing the dummy gate material.

20. The method of claim 13, where forming the gate stack comprises a replacement gate process that removes a dummy gate material leaving a gate opening in a dielectric material, and where the gate insulator layer is deposited prior to deposition of the dummy gate material and is exposed within the gate opening subsequent to removing the dummy gate material.

21. The method of claim 6, where depositing the layer of band edge gate metal also deposits the layer of band edge gate metal upon sidewalls of openings formed in a layer of dielectric material at the locations of the source and drain of the transistor.

22. The method of claim 6, where depositing the layer of band edge gate metal also deposits the layer of band edge gate metal upon sidewalls of an opening formed in the gate region.

23. The method of claim 13, where depositing the layer of band edge gate metal also deposits the layer of band edge gate metal upon sidewalls of openings formed in a layer of dielectric material at the locations of the source/drain contacts.

24. The method of claim 13, where depositing the layer of band edge gate metal also deposits the layer of band edge gate metal upon sidewalls of an opening formed at a location of the gate stack.

* * * * *